United States Patent

Rach et al.

[11] Patent Number: 5,753,414
[45] Date of Patent: May 19, 1998

[54] PHOTOPOLYMER PLATE HAVING A PEELABLE SUBSTRATE

[75] Inventors: Joseph F. Rach, Newark; Albert Roshelli, Jr., Wilmington, both of Del.

[73] Assignee: MacDermid Imaging Technology, Inc., Waterbury, Conn.

[21] Appl. No.: 537,567

[22] Filed: Oct. 2, 1995

[51] Int. Cl.$^6$ .................. G03F 7/40; G03F 7/11
[52] U.S. Cl. .............. 430/309; 430/259; 430/300; 430/306
[58] Field of Search .................. 430/259, 300, 430/309, 306

[56] References Cited

U.S. PATENT DOCUMENTS

| | | | |
|---|---|---|---|
| 2,673,151 | 3/1954 | Gerhart | 95/7 |
| 2,760,863 | 8/1956 | Plambeck | 95/5.6 |
| 2,893,868 | 7/1959 | Barney | 96/115 |
| 2,902,365 | 9/1959 | Martin | 96/35 |
| 2,949,361 | 8/1960 | Agens | 96/115 |
| 3,024,180 | 3/1962 | McGraw | 204/163 |
| 3,060,023 | 10/1962 | Burg | 96/28 |
| 3,060,025 | 10/1962 | Burg | 96/28 |
| 3,149,975 | 9/1964 | Notley | 96/115 |
| 3,210,187 | 10/1965 | Thommes | 430/306 |
| 3,458,311 | 7/1969 | Alles | 96/35.1 |
| 3,469,982 | 9/1969 | Celeste | 96/35.1 |
| 3,556,791 | 1/1971 | Suzuki | 96/35.1 |
| 3,628,963 | 12/1971 | Akamatsu | 96/115 R |
| 3,658,531 | 4/1972 | Kurtz | 96/36.3 |
| 3,661,575 | 5/1972 | Ketley | 96/35.1 |
| 3,663,222 | 5/1972 | Akamatsu | 96/35.1 |
| 3,674,486 | 7/1972 | Milgrom | 96/35.1 |
| 3,677,920 | 7/1972 | Kai | 204/159.15 |
| 3,713,864 | 1/1973 | Ackerman | 117/38 |
| 3,765,898 | 10/1973 | Bauer | 96/115 P |
| 3,782,961 | 1/1974 | Takahashi | 96/115 R |
| 3,794,494 | 2/1974 | Kai | 96/35.1 |
| 3,796,578 | 3/1974 | Hosoi | 96/67 |
| 3,804,631 | 4/1974 | Faust | 96/115 |
| 3,833,384 | 9/1974 | Noonan | 96/115 P |
| 3,850,770 | 11/1974 | June | 204/159.19 |
| 3,858,510 | 1/1975 | Kai | 101/395 |
| 3,948,665 | 4/1976 | Richter | 96/86 P |
| 3,960,572 | 6/1976 | Ibata | 96/115 P |
| 4,006,024 | 2/1977 | Ibata | 96/115 R |
| 4,017,652 | 4/1977 | Gruber | 427/54 |
| 4,019,972 | 4/1977 | Faust | 204/159.15 |
| 4,023,973 | 5/1977 | Imaizumi | 96/115 R |
| 4,042,386 | 8/1977 | Okai | 96/35.1 |
| 4,045,231 | 8/1977 | Toda | 96/115 P |
| 4,057,431 | 11/1977 | Finelli | 96/115 R |
| 4,088,498 | 5/1978 | Faust | 96/115 P |
| 4,120,721 | 10/1978 | Ketley | 96/36.3 |
| 4,133,723 | 1/1979 | Howard | 204/15 |
| 4,137,081 | 1/1979 | Pohl | 96/87 R |
| 4,139,436 | 2/1979 | Jasani | 204/159.16 |
| 4,162,162 | 7/1979 | Dueber | 96/115 P |
| 4,162,919 | 7/1979 | Richter | 96/87 R |
| 4,168,982 | 9/1979 | Pazos | 96/115 P |
| 4,177,074 | 12/1979 | Proskow | 430/286 |
| 4,197,130 | 4/1980 | Nakamura | 430/286 |
| 4,221,646 | 9/1980 | Finelli | 204/159.19 |
| 4,264,705 | 4/1981 | Allen | 430/271 |
| 4,266,005 | 5/1981 | Nakamura | 430/271 |
| 4,266,007 | 5/1981 | Hughes | 430/306 |

(List continued on next page.)

*Primary Examiner*—Cynthia Hamilton
*Attorney, Agent, or Firm*—John L. Cordani

[57] ABSTRACT

A printing plate laminate is formed of a carrier sheet, sticky back, a substrate and photopolymer layer. The substrate has a thickness of only about 0.2 mil to about 3 mil. The printing plate laminate can be formed from a process wherein photopolymerizable resin is coated onto a bilayer substrate, where one layer of the substrate is in contact with the photopolymer layer and has a thickness of about 0.2 mil to about 3 mil, and a second layer of the substrate has a thickness of about 4 mil to about 7 mil. A pressure sensitive adhesive lies between the first and second layers of the substrate, so that the second layer may be easily peeled away from the first layer after selectively curing and then developing the photopolymer layer.

7 Claims, 1 Drawing Sheet

U.S. PATENT DOCUMENTS

| | | | |
|---|---|---|---|
| 4,269,930 | 5/1981 | Kress | 430/270 |
| 4,272,608 | 6/1981 | Proskow | 430/288 |
| 4,273,857 | 6/1981 | Leberzammer | 430/281 |
| 4,275,142 | 6/1981 | Hosaka | 430/271 |
| 4,320,188 | 3/1982 | Heinz | 430/281 |
| 4,323,636 | 4/1982 | Chen | 430/271 |
| 4,323,637 | 4/1982 | Chen | 430/271 |
| 4,332,873 | 6/1982 | Hughes | 430/15 |
| 4,361,640 | 11/1982 | Pine | 430/275 |
| 4,369,246 | 1/1983 | Chen | 430/306 |
| 4,387,139 | 6/1983 | Herwig | 428/423.9 |
| 4,423,135 | 12/1983 | Chen | 430/271 |
| 4,427,759 | 1/1984 | Gruetzmacher | 430/273 |
| 4,431,723 | 2/1984 | Proskow | 430/286 |
| 4,442,302 | 4/1984 | Pohl | 204/159.23 |
| 4,460,675 | 7/1984 | Gruetzmacher | 430/300 |
| 4,460,738 | 7/1984 | Frentzel | 524/591 |
| 4,493,807 | 1/1985 | Vyvial | 264/101 |
| 4,517,279 | 5/1985 | Worns | 430/286 |
| 4,528,334 | 7/1985 | Knopf | 525/404 |
| 4,716,094 | 12/1987 | Minoishi | 430/284 |
| 4,734,476 | 3/1988 | Sato | 526/304 |
| 4,762,892 | 8/1988 | Koch | 525/279 |
| 4,806,449 | 2/1989 | Hoffmann | 430/281 |
| 4,842,987 | 6/1989 | Elzer | 430/281 |
| 4,857,434 | 8/1989 | Klinger | 430/286 |
| 4,894,315 | 1/1990 | Feinberg | 430/281 |
| 4,956,252 | 9/1990 | Fryd | 430/138 |
| 4,990,428 | 2/1991 | Shimiza | 430/276 |
| 4,994,344 | 2/1991 | Kurtz | 430/273 |
| 5,034,306 | 7/1991 | Gersdort | 430/284 |
| 5,073,477 | 12/1991 | Kusuda | 430/287 |
| 5,077,175 | 12/1991 | Fryd | 430/273 |
| 5,085,974 | 2/1992 | Frass | 430/284 |
| 5,185,234 | 2/1993 | Nakatsukasa | 430/284 |
| 5,204,222 | 4/1993 | Gersdorf | 430/281 |
| 5,213,948 | 5/1993 | Abele | 430/272 |
| 5,227,279 | 7/1993 | Kawabata | 430/281 |
| 5,250,389 | 10/1993 | Nakamura | 430/281 |
| 5,268,257 | 12/1993 | Mirle | 430/285 |
| 5,281,510 | 1/1994 | Sakurai | 430/283 |
| 5,290,663 | 3/1994 | Haynh-Tran | 430/284 |

…

PHOTOPOLYMER PLATE HAVING A PEELABLE SUBSTRATE

FIELD OF THE INVENTION

The invention is directed to a photopolymer printing plate, and more particularly to a plate with a peelable, multi-functional substrate.

BACKGROUND OF THE INVENTION

In a typical manufacturing process for photopolymer printing plates, a photopolymerizable composition is sandwiched between two sheets, commonly called a cover film and a substrate. The photopolymerizable composition is exposed to actinic radiation in an image-wise fashion, where the radiation is directed through the cover film. The term image-wise fashion means that before the actinic radiation impinges on the photopolymerizable composition, it first impinges on a transparency film that contains the image to be transferred to the photopolymerizable composition. The transparency film contains regions that are either opaque or transparent to the actinic radiation, so that actinic radiation is selectively transferred to the photopolymerizable composition only through the transparent regions of the transparency film. Commonly, the actinic radiation passes through transparent regions of the transparency film, through the cover film which is wholly transparent to actinic radiation, and then into the photopolymerizable composition.

When the photopolymerizable composition is exposed to actinic radiation, it crosslinks. Thus image-wise exposure of a layer of photopolymerizable composition to actinic radiation provides a layer of crosslinked photopolymerizable composition in the image of the transparency film. After removing the cover film, a relief layer is formed by washing away the unexposed, non-crosslinked photopolymerizable composition from the crosslinked photopolymerizable composition. Through proper choice of photopolymerizable composition and actinic radiation intensity, duration and direction, a photopolymer plate 10 is formed as shown in FIG. 1, having a photopolymer layer 12 including a relief layer 14 and a base layer 16 formed of crosslinked photopolymerizable composition, which sits on top of a substrate 18. The substrate 18 typically has a thickness of about 4 mil to about 7 mil. The substrate 18 typically has a photosensitive adhesive layer (not shown) on that side of the substrate which is directed toward the base layer 16.

In order to print with the photopolymer plate, the substrate is adhered to a carrier sheet, optionally with a layer of foam disposed therebetween, to form a printing laminate. This mounting operation is typically done while the carrier sheet is positioned on the printing press cylinder, or at least an analog thereof having the same shape and dimension. For example, the carrier sheet may be made of steel, which is magnetically or otherwise held against the metal cylinder of the printing press, and then a layer of foam having adhesive on both sides, commonly called sticky back, is mounted to the carrier sheet. The photopolymer plate is then positioned against, and adheres to, the sticky back, to thereby form a printing laminate.

After the printing operation is complete, the printing laminate comprising carrier sheet, optionally sticky back, and photopolymer plate can be removed from the cylinder and stored for future use. During or after removing the printing laminate from the press, as in the case with a magnetic carrier, the printing laminate may inadvertently be reverse curved, which may cause the laminate to buckle. The term "reverse curved" refers to bending the laminate in the direction opposite to that in which it was bent when the laminate was mounted to the cylinder. Such reverse curving can distort the curvature of the laminate compared to the curvature it had when it was mounted on the cylinder.

The printing laminate is typically stored in the round, standing on an edge, or hung up vertically on a wire. During handling, the original curvature of the printing laminate can be lost, resulting in the formation of air gaps between the substrate of the photopolymer plate and the sticky back or carrier sheet. Once these air gaps appear, the relief image of the printing laminate has a buckled appearance, and the printing laminate cannot be used to print at the same quality level that was possible before the air gaps appeared.

It is possible to prepare a printing laminate where each of the composite layers is flat when joined to the adjacent layer, i.e., not mounted on a curved cylinder. However, a printing laminate prepared in this manner distorts when mounted on a printing press cylinder, thus leading to printing of unacceptably poor quality.

There is thus a need in the art for a photopolymer plate that can be mounted on a cylinder to form a printing laminate, where the printing laminate can be handled and stored for extended periods of time without developing air gaps between two or more of the laminate layers.

SUMMARY OF THE INVENTION

The invention provides for a photopolymer printing plate comprising a photopolymer layer and a substrate. The substrate comprises a film bilayer that includes a first layer of dimensionally stable polymeric film having a thickness of about 0.2 mil to about 3 mil, a second layer of dimensionally stable polymeric film having a thickness of about 4 mil to about 7 mil and a pressure sensitive adhesive between the first and second layers. The first layer of dimensionally stable film supports the photopolymer layer on a side opposite the pressure sensitive adhesive. A layer of photosensitive adhesive may be disposed between the first layer of dimensionally stable film and the photopolymer layer.

Another aspect of the invention is a printing laminate comprising a photopolymer layer and a substrate. The substrate is formed from a dimensionally stable polymeric film having a thickness of about 0.2 mil to about 3 mil. The photopolymer layer is formed upon directing actinic radiation into a photopolymerizable composition. The printing laminate may further comprise a layer of photosensitive adhesive disposed between the photopolymer layer and the substrate. In addition or alternatively, the printing laminate may further comprise a carrier sheet for mounting to a printing press cylinder, where the carrier sheet adheres to the substrate through use of a suitable adhesive. In addition or alternatively, a layer of sticky back may be disposed between the carrier sheet and the substrate.

According to another aspect of the invention, a method is described for forming a photopolymer printing plate. The method comprises the step of (a) of forming a laminate of a cover film, a photopolymerizable composition and a film bilayer substrate, where the bilayer substrate comprises a first layer of dimensionally stable polymeric film having a thickness of about 0.2 mil to about 3 mil, a second layer of dimensionally stable polymeric film having a thickness of about 4 mil to about 7 mil and a pressure sensitive adhesive between the first and second layers, and where the first layer of dimensionally stable film supports the photopolymerizable composition. The method further comprises the step (b), which is exposing the photopolymerizable composition to actinic radiation in an image-wise fashion. The method also comprises the step (c) of peeling the second layer of dimensionally stable film away from the first layer of dimensionally stable film. The photopolymer printing plate of step (c) may be mounted to sticky back and then to a carrier sheet for mounting to a printing press cylinder, or the photopolymer printing plate of step (c) may be mounted directly to a carrier sheet for mounting to a printing press cylinder.

BRIEF DESCRIPTION OF THE DRAWINGS

The foregoing summary, as well as the following detailed description of the preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF THE PREFERRED EMBODIMENTS

Figure 1:
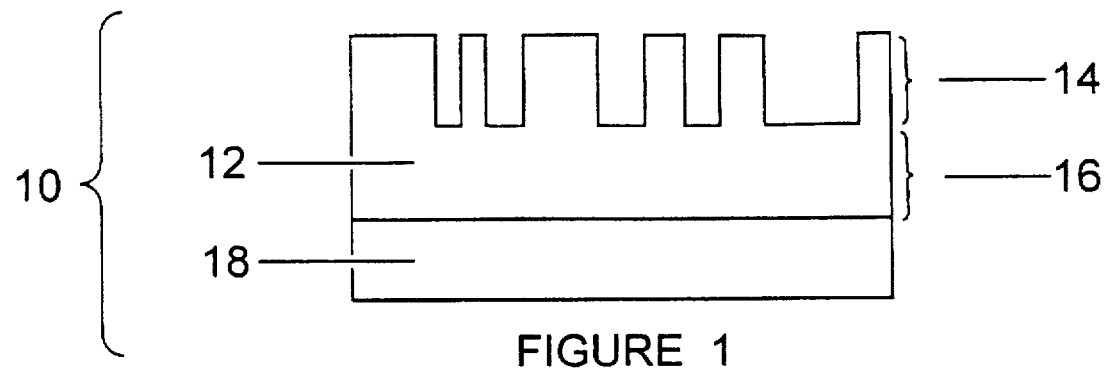
FIG. 1 is a side view of a photopolymer printing plate according to the prior art.
Figure 2:
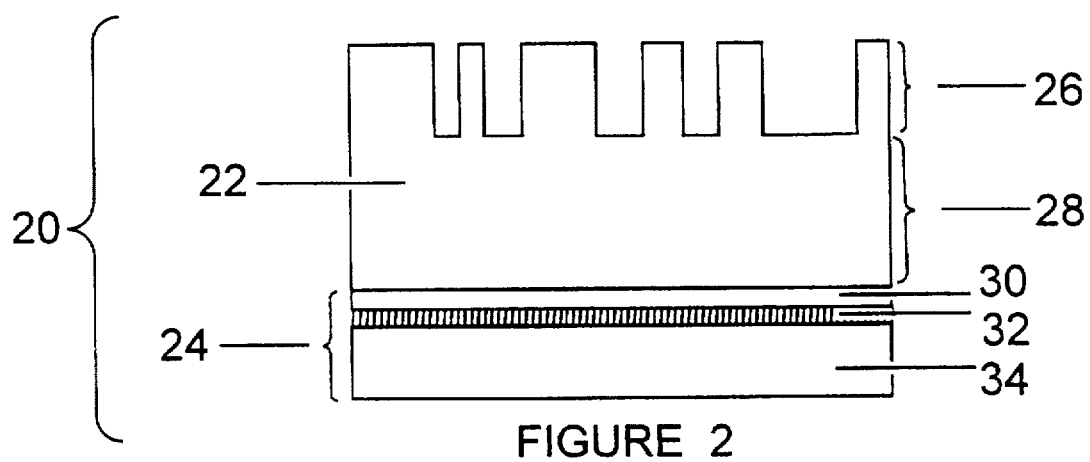
FIG. 2 is a side view of a photopolymer printing plate according to the invention.

A preferred photopolymer plate 20 of the invention is shown in FIG. 2, and comprises a photopolymer layer 22 and a substrate 24. The photopolymer layer 22 has a relief layer 26 and a base layer 28, both formed of crosslinked photopolymerizable composition. The substrate 24 is a bilayer of two dimensionally stable polymeric :Films held together by a pressure sensitive adhesive. One of the polymeric films, denoted the first polymeric film 30, is immediately adjacent to and supports the base layer 28 of the photopolymer layer 22. The other polymeric film, denoted the second polymeric film 34, is separated from the first polymeric film by a layer of pressure sensitive adhesive 32. A photosensitive adhesive (not shown) is disposed between the base layer 28 and the first polymeric film 30, in order that the base layer 28 will have the preferred level of adhesion to the film 30.

It has been surprisingly found that the buckling problem that is observed upon handling and storing standard printing laminates, which typically have a substrate thickness of about 4 mil to, more commonly 7 mil, and which were prepared by mounting the photopolymer plate on a round cylinder, is eliminated or at least much reduced when the layer which supports the photopolymerizable composition in use and storage is reduced to about 0.2 mil to about 3 mil, preferably about 0.2 to 2 mil, and more preferably about 0.5 to 1.5 mil. However, it has also been found that during the process typically used to manufacture photopolymer printing plates, a substrate thickness of about 0.2 mil to about 2 mil is insufficient to provide the structural stability to the photopolymer plate that is needed in order for the plate to retain its integrity during the developing process and other manufacturing steps. Thus, the invention provides for a bilayer, or two-ply substrate 24, where the sum of the two plys has a thickness of about 4–7 mil, preferably about 7 mil. In this way, the manufacture of the photopolymer plate can proceed with a 7 mil substrate, to which plate manufacturers have become accustomed. However, just prior to mounting the plate on a printing press cylinder, the second polymeric film 34, which is further from the photopolymer layer 22, can be peeled away leaving behind a first polymeric film 30 of only about 0.2 mil to about 3 mil thickness as the sole supporting substrate. Because the second polymeric film 34 is ultimately not present in a printing laminate, the film 34 may be referred to as a disposable layer.

The photopolymer layer 22 according to the invention is well known in the art, and is variously referred to as photopolymerizable recording layer composition, photopolymer, photosensitive composition, photosensitive elastomer composition, photopolymerizable composition, photocurable composition, photocrosslinkable composition, photocurable elastomeric composition, photocurable elastomeric mixture, photopolymerizable element, photosensitive resin composition, photopolymer composition, radiation polymerizable mixture, actinic radiation-curable formulation and radiation curable composition, among other terms. The essential features of these compositions are that (1) they are polymerized upon exposure to appropriate actinic radiation, (2) they can be used to form a relief layer in e.g., flexographic printing plate manufacture, and (3) selectively polymerized compositions may be developed using a developer solution according to techniques known in flexographic printing plate manufacturing.

Photopolymer layers according to the invention are prepared from photopolymerizable compositions which include, but are not limited to, those mentioned or described in the following U.S. Pat. Nos.: 5,290,663; 5,281,510; 5,268,257; 5,250,389; 5,227,279; 5,213,948; 5,204,222; 5,185,234; 5,085,974; 5,077,175; 5,073,477; 5,034,306; 4,994,344; 4,990,428; 4,956,252; 4,894,315; 4,857,434; 4,842,987; 4,806,449; 4,762,892; 4,737,521; 4,734,476; 4,716,094; 4,528,334; 4,517,279; 4,493,807; 4,460,738; 4,460,675; 4,446,440; 4,442,302; 4,442,302; 4,442,302; 4,431,723; 4,431,723; 4,427,759; 4,427,749; 4,423,135; 4,387,139; 4,369,246; 4,361,640; 4,332,873; 4,323,637; 4,323,637; 4,323,636; 4,323,636; 4,320,188; 4,275,142; 4,273,857; 4,272,608; 4,269,930; 4,266,007; 4,266,005; 4,266,005; 4,264,705; 4,221,646; 4,198,242; 4,197,130; 4,197,130; 4,177,074; 4,177,074; 4,177,074; 4,177,074; 4,168,982; 4,162,919; 4,162,919; 4,162,162; 4,139,436; 4,137,081; 4,133,723; 4,120,721; 4,088,498; 4,057,431; 4,057,431; 4,045,231; 4,045,231; 4,042,386; 4,023,973; 4,023,973; 4,019,972; 4,017,652; 4,006,024; 3,960,572; 3,960,572; 3,960,572; 3,948,665; 3,858,510; 3,850,770; 3,850,770; 3,833,384; 3,804,631; 3,796,578; 3,794,494; 3,794,494; 3,782,961; 3,765,898; 3,713,864; 3,677,920; 3,674,486; 3,663,222; 3,661,575; 3,658,531; 3,658,531; 3,658,531; 3,628,963; 3,556,791; 3,556,791; 3,469,982; 3,458,311; 3,149,975; 3,060,025; 3,060,023; 3,024,180; 2,949,361; 2,902,365; 2,893,868; 2,760,863; 2,760,863; 2,760,863; 2,760,863; and 2,673,151. The above-listed patents are incorporated herein by reference, in their entirety.

The vast majority of photopolymerizable compositions known in the art, which may be used in this invention, comprise three important components: (1) polymeric binder, also referred to as polymer, organic polymer, binder, prepolymer, etc., (2) multifunctional monomer, also referred to as photopolymerizable monomer, hardening agent, insolubilizing material, crosslinking agent, etc., and (3) photopolymerization initiator, also referred to as a photoinitiator, photosensitive initiator, etc.

The photopolymer layer according to the invention is defined to include a layer of completely non-crosslinked, photopolymerizable, composition, i.e., a photopolymerizable composition that has not been exposed to actinic radiation. Alternatively, the photopolymer layer may be a layer of selectively crosslinked photopolymerizable composition as arises after image-wise exposure of the layer to actinic radiation. As another possibility, the photopolymer layer may be a completely crosslinked layer of photopolymerizable composition as arises after development of a layer of photopolymerizable composition that has undergone image-wise exposure to actinic radiation. Preferably, as shown in FIG. 2, the photopolymer layer 22 has a relief image, i.e., it is formed of a layer of photopolymerizable composition that has been exposed in an image-wise fashion to actinic radiation, and then developed to remove non-crosslinked photopolymerizable composition.

The dimensionally stable polymeric films of the substrate do not exhibit substantial deformation upon application of a tensile force, i.e., they do not stretch when pulled. Also, the polymeric films are preferably transparent to actinic radiation. Suitable dimensionally stable polymeric films include polyesters such as Mylar®, polyacetate, cellulosic films such as cellophane, polyethylene and polypropylene. Polyester is a preferred dimensionally stable polymeric film for the invention. The polymeric film of the first layer of the photopolymer printing plate of the invention may be the same or different than the polymeric film of the second layer of the photopolymer printing plate of the invention. Preferably, polyester film is used in both the first and second layers of the substrate.

The substrate may be prepared by a process that begins by simply coating either a first dimensionally stable polymeric film having a thickness of about 0.2 mil to about 3 mil, preferably about 0.2 to about 2 mil, and more preferably about 0.5 to about 1.5 mil, or a second dimensionally stable polymeric film having a thickness of about 4 mil to about 7 mil, with a pressure sensitive adhesive. The pressure sensitive adhesive is preferably applied to the second dimensionally stable polymeric film because in this way, when the second polymeric film is peeled away from the first polymeric film, the pressure sensitive adhesive will tend to remain with the second polymeric film.

Such pressure sensitive adhesives are well known in the art. An exemplary adhesive is Spray Mount® artist's adhesive from 3M Company (St. Paul, Minn.). Spray Mount® adhesive is delivered from an aerosol can, and thus the dimensionally stable polymeric film may be satisfactorily coated simply by spraying the adhesive over the film. Multiple coatings of the adhesive may be necessary. The adhesive should be sufficiently strong to hold the first and second dimensionally stable films together during the manufacture of the photopolymer plate, but sufficiently weak to then allow the second sheet to be easily removed (peeled) from the first sheet, at room temperature, without tearing or otherwise damaging the first sheet.

After a pressure sensitive adhesive-coated dimensionally stable polymeric film has been prepared, a dimensionally stable polymeric film is placed on top of, and pressed against, the pressure sensitive adhesive. The laminate of first and second dimensionally stable films and the pressure sensitive adhesive may be smoothed out using a Modern Solutions Poliwand® or other antistatic film flattening wand to ensure that there are no air pockets within the resulting film bilayer.

Instead of making the film bilayer as described above, a suitable bilayer material for the substrate is commercially available from Hercules Incorporated (Wilmington, Del.) as Hercules Substrate 44 3048 LP, which has a 1 mil thick layer of polyester film laminated with a pressure sensitive adhesive to a 4 mil thick layer of polyester film. This Hercules bilayer is a preferred substrate for the invention.

The photopolymer plate of the invention can be prepared with manufacturing equipment commonly used in the manufacture of flexographic printing plates from photopolymerizable compositions. One point should be kept in mind, however. Printers are accustomed to working with printing laminates of a certain thickness. Thus, a printer may have his or her printing equipment set up to use a carrier sheet of 10 mil thickness, a sticky back of 20 mil thickness and a photopolymer plate of 160 mil thickness where 7 of those mil are due to the presence of the substrate. When the substrate in the photopolymer plate is only 1 mil, then the printing laminate formed from this photopolymer plate will extend 6 mils less from the surface of the printing cylinder than the printer is accustomed to. As the printing press is set up for a certain constant distance from the surface of the printing cylinder to the surface of the relief layer, an adjustment must be made when the thickness of the substrate is reduced from 7 mil to only about 1 mil.

Therefore, it is preferred that photopolymer plates of the invention having a two ply substrate be made thicker, by an amount equal to the thickness of the disposable layer, than a typical photopolymer plate that from the start has only a single ply substrate. Such a thicker plate can be readily made by increasing the thickness of the photopolymer layer. A thicker photopolymer layer can be created with standard equipment, using shims in the manufacturing process, where the shims raise the dam within which the photopolymerizable composition is held. By raising the dam, a greater thickness of photopolymerizable composition may be applied to the substrate and then exposed to actinic radiation, resulting in a thicker photopolymer layer.

As stated above, the photopolymer plate of the invention can be prepared using standard, commercially available equipment designed for making flexographic printing plates from photopolymerizable compositions. Hercules Incorporated (Wilmington, Del.) makes and sells such equipment under the Merigraph® trademark. A Merigraph® 3048 exposure unit used according to its standard operating procedure, is well-suited for making photopolymer plates according to the invention.

Using a Merigraph® 3048 exposure unit, a transparency film is placed on top of a lower glass plate, through which actinic radiation may be directed from below. A cover film is placed on top of the transparency film, and a layer of photopolymerizable composition is placed on top of the cover film. The cover film serves to protect the transparency film from the photopolymerizable composition. A suitable cover film material, which is commonly used in the art, is made from polypropylene. After a leveling blade has smoothed out the surface of the photopolymerizable composition, the bilayer substrate of the invention is placed on top of the photopolymerizable composition. The substrate should be placed so that the first, thinner film, having a thickness of about 0.2 mil to about 3 mil, preferably about 0.2 to about 2 mil, and more preferably about 0.5 to about 1.5 mil, directly contacts the photopolymerizable composition and will ultimately support it directly during use and storage. A photosensitive adhesive, coated onto the first film, may optionally be present between the first film and the photopolymerizable composition.

After image-wise exposure to actinic radiation, the cover film+photopolymer layer+substrate is removed from the exposure unit, and the cover film is then stripped away. The photopolymer layer+substrate is then placed in a developer unit. Suitable developer units are also manufactured and available from Hercules Incorporated (Wilmington, Del.). The developer unit removes the non-crosslinked photopolymerizable material from the photopolymer layer, to provide a relief image.

The photopolymer layer with relief image+substrate is then removed from the developer unit and prepared for mounting to a printing press cylinder by removing the second layer of polymeric film. Thus, the photopolymer plate that will be mounted to the cylinder has a substrate of only about 0.2 mil to about 3 mil thickness. Preferably, the pressure sensitive adhesive between the first and second layers of polymeric film will remain adhered to the second layer of polymeric film.

Figure 3:
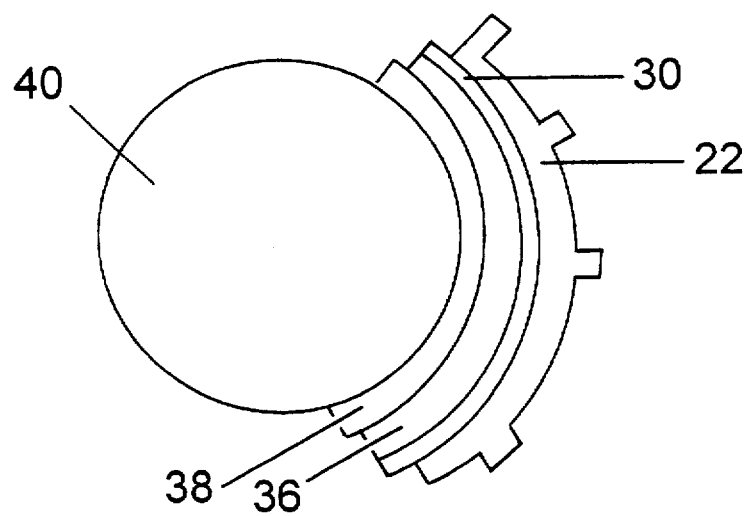
FIG. 3 is a side view of a printing laminate according to the invention.

Preferably, in mounting the photopolymer plate to form the printing laminate, a carrier sheet 38 is attached to a printing press cylinder or analog thereof 40 as shown in FIG. 3. The carrier sheet 38 may be formed of steel, aluminum, polyvinylchloride or other material that is typically used in the art. A typical carrier sheet 38 has a thickness of about 10 mil. To the carrier sheet is attached a layer of sticky back 36. Sticky back 36 is a sheet of foam, having a uniform thickness of about 20 mil, and having pressure sensitive adhesive coated on both the front and back faces of the foam sheet. Sticky back 36 is commercially available from, e.g., 3M Industrial Specialties Division (St. Paul, Minn.) and Lohmann Technologies (Erlanger, Ky.) and is very commonly used in the manufacture of printing laminates.

The photopolymer plate 20 prepared as described above, and having a substrate 30 with a thickness of only about 0.2 mil to about 3 mil, is then mounted against the exposed face of the sticky back, thus forming a printing laminate according to the invention. After printing with the printing laminate of the invention, the laminate may be removed from the printing press cylinder and stored with minimal occurrence of buckling or other separation between two or more of the layers of the printing laminate.

The following examples are set forth as a means of illustrating the present invention and are not to be construed as a limitation thereon.

EXAMPLE 1

A bilayer substrate was prepared by spraying three coats of 3M Spray Mount® artist's spray adhesive onto the non-adhesive side of 7 mil (0.007 inch) thickness polyester film (3048-44, Hercules Incorporated, Wilmington, Del.). As commercially available and as used herein, Hercules 3048-44 has a layer of photosensitive adhesive coated on one of the two sides of the film. The "non-adhesive side" of the Hercules 3048-44 polyester film is that side which does not have a layer of photosensitive adhesive. This coated film was placed on a table with the pressure sensitive adhesive side up. A 1 mil thickness polyester film was rolled into a tube with the photosensitive adhesive side in, and the non-adhesive side out. The 1 mil film was then rolled out over the 7-mil substrate so that the non-adhesive side of the 1-mil substrate was laminated to the side of the 7-mil substrate which had been spray-coated with the 3M spray adhesive. This lamination was smoothed out using a Modern Solutions Poliwand™ antistatic film flattening wand to ensure a smooth lamination with no air pockets. In a preferred practice, the disposable layer would not need to have a coating of photosensitive adhesive.

155-mil Plates with 60-mil relief were manufactured using Merigraph® Systems base resin G125 and cap resin FC55-1. These plates were produced on a Merigraph® System 3048 exposure unit according to the usual process of using this machine. The substrate was prepared as described above, where the 1 mil film was directed toward the layer of base resin, with the coating of photosensitive adhesive disposed therebetween. Extra shim thickness was required in the equipment set up to compensate for the 7-mil substrate which is peeled off after the plate-making process is complete.

The plates made above were mounted in the round on a 10-mil metal shim using a 20-mil sticky back. The plates were placed onto magnetic cylinders in an Evers Split Stack Printing Press to print a polyethylene-coated, 25-point paper board stock commonly used in milk carton printing with water-based inks. The repeat length of the cylinder was 18.02 inches. The plates ran for approximately 45 minutes yielding a commercially acceptable product. The thinner gauge stabilizing layer in the plate produced by this method significantly reduced buckling and provided acceptable print quality and registration.

EXAMPLE 2

155-mil plates with 35-mil relief were manufactured using Merigraph® Systems base resin G125 and cap resin FC55-1. These plates were produced on a Merigraph System 3048 exposure unit in the usual manner employing a bilayer substrate prepared as in Example 1.

The plates made above were mounted in the round on a 10-mil metal shim using a 20-mil sticky back. The plates were placed onto magnetic cylinders in an Evers Split Stack Printing Press to print a polyethylene-coated, 25-point paper board stock commonly used in milk carton printing with water-based inks. The repeat length of the cylinder was 22.68 inches.

These plates were mounted and did not demonstrate excessive buckling. The plates ran for approximately 5 hours yielding a commercially acceptable product. The thin gauge substrate of the printing laminate of this Example significantly reduced buckling compared to a 7 mil substrate film, and provided acceptable print quality and registration.

EXAMPLE 3

67-mil Plates with 28-mil relief were manufactured using Merigraph® Systems base resin G125 and cap resin FC55-1.

These plates were produced on a Merigraph System 3048 exposure unit in the usual manner, employing a bi-layer substrate as prepared in Example 1. The plates were mounted in the round on a 10-mil metal shim using a 20-mil sticky back. The plates were placed onto magnetic cylinders in an Evers Split Stack Printing Press to print a polyethylenecoated, 25-point paper board stock commonly used in milk carton printing with water-based inks. The repeat length of the cylinder was 18 inches.

The plates ran for approximately 25 minutes yielding a commercially acceptable product. The thinner gauge stabilizing layer in the plate produced by this method significantly reduced buckling and provided acceptable print quality and registration.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for forming a photopolymer printing plate, comprising the steps of (a) forming a laminate of a cover film, a photopolymerizable composition and a film bilayer substrate, the bilayer substrate comprising a first layer of dimensionally stable polymeric film having a thickness of about 0.2 mil to about 3 mil, a second layer of dimensionally stable polymeric film having a thickness of about 4 mil to about 7 mil and a pressure sensitive adhesive between the first and second layers, wherein the first layer of dimensionally stable film is adjacent to the photopolymerizable composition, (b) exposing the photopolymerizable composition to actinic radiation in an image-wise fashion, and (c) peeling the second layer of dimensionally stable film away from the first layer of dimensionally stable film.

2. The method of claim 1 wherein the polymeric films of the first and second layers are independently selected from the group consisting of polyester, polyacetate, cellulosic films, polyethylene and polypropylenex.

3. The method of claim 1 wherein the polymeric film of both the first and second layers is polyester.

4. The method of claim 1 wherein the pressure sensitive adhesive is one which allows the first and second dimensionally stable films to be held together but allows the second sheet to be easily removed from the first sheet, at room temperature, without tearing the first sheet.

5. The method of claim 1 further comprising mounting the photopolymer printing plate of step (c) to sticky back.

6. The method of claim 1 further comprising mounting the photopolymer printing plate to a carrier sheet for mounting to a printing press cylinder.

7. The method of claim 6 further comprising mounting a layer of sticky back to the carrier sheet, and mounting the photopolymer printing plate to the layer of sticky back.

* * * * *